United States Patent
Xiong et al.

(10) Patent No.: US 11,271,589 B2
(45) Date of Patent: Mar. 8, 2022

(54) MEMORY SYSTEM WITH ERROR-REDUCTION SCHEME FOR DECODING AND METHOD OF OPERATING SUCH MEMORY SYSTEM

(71) Applicant: SK hynix Inc., Gyeonggi-do (KR)

(72) Inventors: Chenrong Xiong, San Jose, CA (US); Fan Zhang, Fremont, CA (US); Haobo Wang, Sunnyvale, CA (US); Xuanxuan Lu, San Jose, CA (US); Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 96 days.

(21) Appl. No.: 16/657,590

(22) Filed: Oct. 18, 2019

(65) Prior Publication Data
US 2021/0119643 A1 Apr. 22, 2021

(51) Int. Cl.
*H03M 13/11* (2006.01)
*H03M 13/43* (2006.01)
*H03M 13/09* (2006.01)

(52) U.S. Cl.
CPC ..... *H03M 13/1108* (2013.01); *H03M 13/096* (2013.01); *H03M 13/43* (2013.01)

(58) Field of Classification Search
CPC . H03M 13/1108; H03M 13/43; H03M 13/096
USPC ........................................................ 714/800
See application file for complete search history.

(56) References Cited

U.S. PATENT DOCUMENTS

| | | | |
|---|---|---|---|
| 9,459,956 B2 | 10/2016 | Hubris et al. | |
| 10,135,464 B2 | 11/2018 | Wang et al. | |
| 10,148,287 B2 | 12/2018 | Xiong et al. | |
| 10,200,064 B1 | 2/2019 | Varnica et al. | |
| 10,547,327 B2* | 1/2020 | Palangappa | G05B 11/42 |
| 2011/0010600 A1* | 1/2011 | Gong | H04L 1/005 |
| | | | 714/752 |
| 2012/0030539 A1* | 2/2012 | Graef | H03M 13/1102 |
| | | | 714/758 |
| 2018/0375530 A1 | 12/2018 | Palangappa et al. | |

OTHER PUBLICATIONS

Guo et al., Reliability ratio based weighted bit-flipping decoding for low-density parity-check codes, IEEE Electronics Letters, Oct. 14, 2004, pp. 1356-1358, vol. 40 No. 21.
(Continued)

*Primary Examiner* — James C Kerveros
(74) *Attorney, Agent, or Firm* — IP & T Group LLP

(57) ABSTRACT

Memory controllers bit-flipping (BF) decoders and methods that selectively apply a checksum-aided error reduction (CA-ER) scheme to BF decoding of a low-density parity-check (LDPC) code. In decoding a codeword, a hard decision value resulting from decoding a select variable node is changed when a first condition is satisfied to yield an updated hard decision value. Also, when the first condition is satisfied, a current checksum value after processing the select variable node is updated using the updated hard decision value. The CA-ER scheme is applied when the updated checksum value is not reduced to a set minimum and a second condition based on a previous checksum value, calculated after a previous variable node is processed, is satisfied.

18 Claims, 6 Drawing Sheets

(56) References Cited

OTHER PUBLICATIONS

Li et al., A Modified Gradient Descent Bit Flipping Decoding Scheme for LDPC Codes, IEEE International Workshop on Signal Processing Systems (SiPS), Oct. 2017, DOI: 10.1109/SiPS.2017.8109969.

Wu et al., Parallel Weighted Bit-Flipping Decoding, IEEE Communications Letters, Aug. 2007, pp. 671-673, vol. 11, No. 8.

Wadayama et al., Gradient descent bit flipping algorithms for decoding LDPC codes, IEEE Transactions on Communications, pp. 1610-1614, Jun. 2010, vol. 58, No. 6.

* cited by examiner

MEMORY SYSTEM WITH ERROR-REDUCTION SCHEME FOR DECODING AND METHOD OF OPERATING SUCH MEMORY SYSTEM

BACKGROUND

1. Field

Embodiments of the present disclosure relate to a memory system that selectively performs a checksum-aided error reduction (CA-ER) scheme in the course of bit-flipping (BF) decoding, and a method of operating such memory system.

2. Description of the Related Art

The computer environment paradigm has shifted to ubiquitous computing systems that can be used anytime and anywhere. As a result, the use of portable electronic devices, such as mobile phones, digital cameras, and notebook computers has rapidly increased. These portable electronic devices generally use a memory system having memory device(s), that is, data storage device(s). A data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

An SSD may include flash memory components and a controller, which includes the electronics that bridge the flash memory components to the SSD input/output (I/O) interfaces. An SSD controller may include an embedded processor that executes functional components such as firmware. SSD functional components are typically device specific, and in most cases, can be updated.

The two main types of flash memories are named after the respective NAND and NOR logic gates that configure them. The individual flash memory cells exhibit internal characteristics similar to those of their corresponding gates. NAND-type flash memory may be written to and read from in blocks (or pages) which are generally much smaller than the entire memory space. NOR-type flash memory allows a single machine word (byte) to be written to an erased location or read independently. NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code used to recover a relatively large number of errors in data. LDPC codes are a class of linear block forward error-correction (ECC) codes, which are characterized by a low-density parity-check matrix, i.e., that contains only a few compared to the number of 0's. LDPC codes provide excellent error correction performance.

Generally, there are two types of LDPC codes: regular and irregular. Given an M×N parity-check matrix H, the column weight of the $i^{th}$ column of H is the number of non-zero entries in the $i^{th}$ column, $0 \le i < N$. If column weights of all columns of H are the same, the LDPC code represented by H is a regular LDPC code. Otherwise, the LDPC code is an irregular LDPC code. In other words, columns of the parity-check matrix H of an irregular LDPC code have different column weights.

Decoding of irregular LDPC codes is performed using iterative decoding methods known for LDPC codes such as bit-flipping (BF) decoding, sum-product algorithm (SPA) or min-sum (MS) algorithm. Usually, the error correction performance of a BF decoding algorithm is worse than those of MS or SPA decoding algorithms for LDPC codes.

Nevertheless, bit-flipping (BF) decoding is important for SSD applications, especially mobile and client SSD applications, because such applications have stringent requirements for power consumption, and BF decoding generally consumes less power than other types of decoding.

In this context embodiments of the present invention arise.

SUMMARY

Embodiments of the present invention provide an improved bit-flipping (BF) decoder which is selectively augmented with a checksum-aided error reduction (CA-ER) scheme to improve decoding performance.

An aspect of the present invention is directed to memory controllers. Such a memory controller includes a storage to store codewords of a low-density parity-check (LDPC) code representable by at least variable nodes; and a decoder operably coupled to the storage and configured to perform decoding on the codewords. During an iteration of decoding of a codeword among the codewords, the memory controller including the decoder is configured to perform decoding of a select variable node to yield a hard decision value, change the hard decision value when a first condition is satisfied to yield an updated hard decision value, update a current checksum value after processing the select variable node, when the first condition is satisfied, using the updated hard decision value, and apply a checksum-aided error recovery (CA-ER) scheme, when the updated checksum value is not reduced to a set minimum and a second condition based on a previous checksum value, calculated after processing a previous variable node, is satisfied.

In another aspect, a decoder is provided. Such decoder is preferably a bit-flipping (BF) decoder for decoding received codewords of an LDPC code representable by at least variable nodes. Such decoder is configured to perform the operations described above. In some embodiments, the decoder may cooperate with one or more other components to carry out the operations.

Further aspects of the present invention include methods of decoding, which may be performed by memory controllers and components thereof such as BF decoders. Such a method is executed to decode received codewords of an LDPC code representable by at least variable nodes. The method comprises, in an iteration of decoding of a codeword among the codewords, performing decoding of a select variable node to yield a hard decision value; changing the hard decision value when a first condition is satisfied to yield an updated hard decision value; updating a current checksum value after processing the select variable node, when the first condition is satisfied, using the updated hard decision value; and applying a checksum-aided error recovery (CA-ER) scheme, when the updated checksum value is not reduced to a set minimum and a second condition based on a is previous checksum value, calculated after processing a previous variable node, is satisfied.

DETAILED DESCRIPTION

Figure 1:
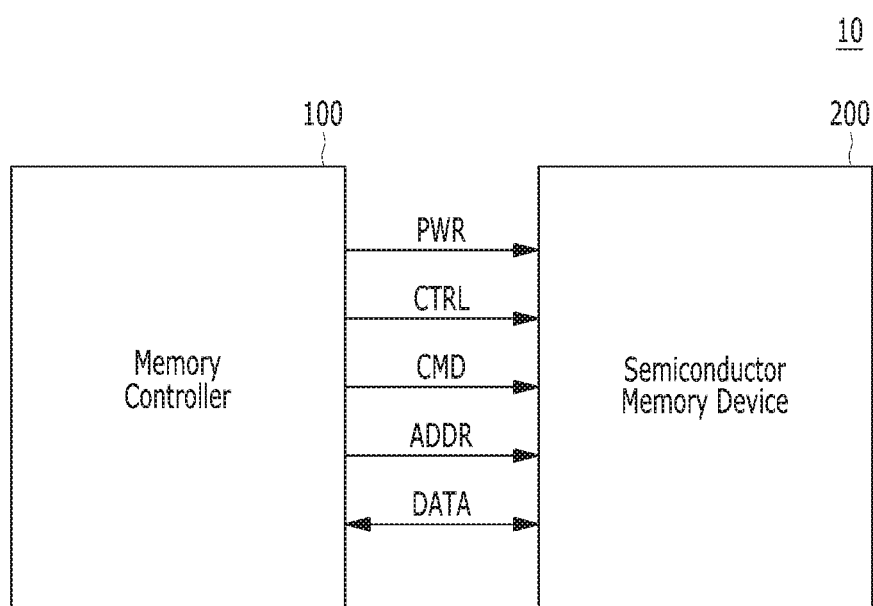
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given is time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, memory controller 100 and semiconductor memory device 200 are sometimes simply referred to below as controller 100 and memory device 200, respectively.

The controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD), The SSD may include a storage device for storing data therein. When the memory system 10 is used in an SSD, operation speed of a host (not shown) coupled to the memory system 10 may remarkably improve.

In another embodiment, the memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In still another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
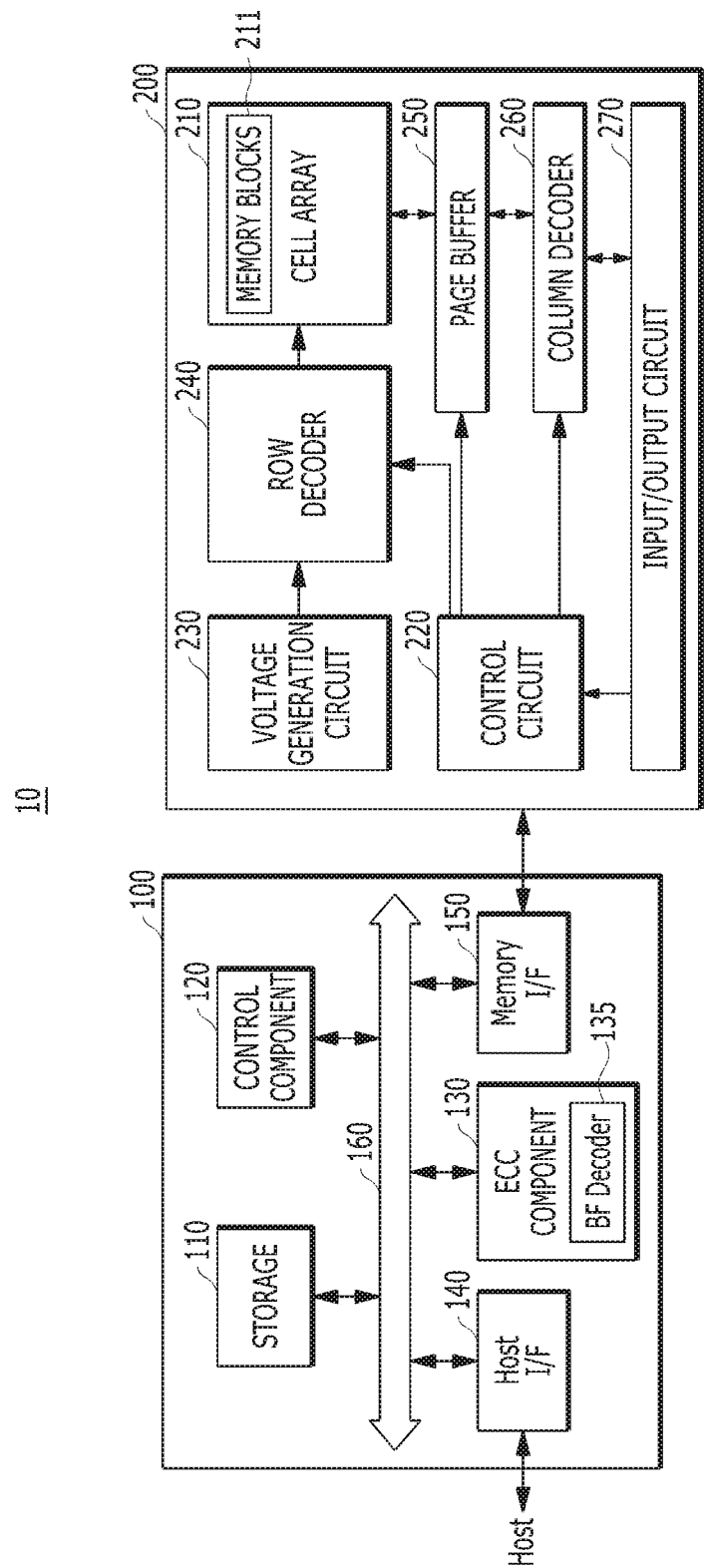
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device, such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure to correct the error bits.

The ECC component 130 may perform an error correction operation based on a coded modulation, such as a low-density parity-check (LDPC) code including both regular and irregular LDPC codes, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). LDPC codes are of particular relevance to embodiments of the present invention.

Thus, the ECC component 130 may include any and all circuits, systems or devices for suitable error correction operation, including detecting and correcting errors in LDPC codes in accordance with embodiments of the present invention. To that end, in embodiments of the present invention, the ECC component 130 includes a BF decoder 135. As explained in more detail below, the BF decoder 135 is configured to execute CA-ER scheme-based BF decoding.

The host interface 140 may communicate with the host device through one or more of various interface protocols, such as a universal serial bus (USB), a multi-media card (MMC), a peripheral component interconnect express (PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
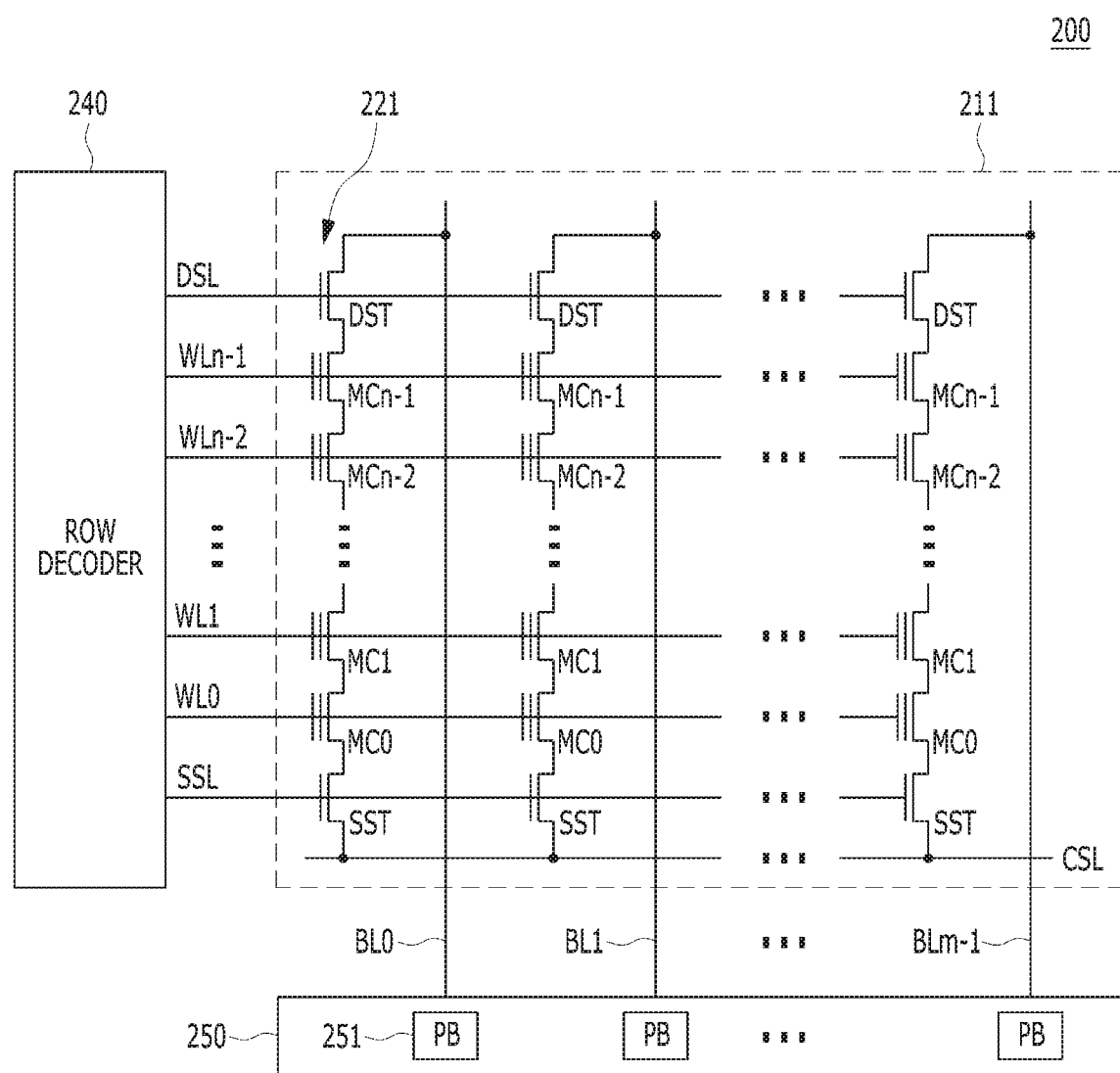
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
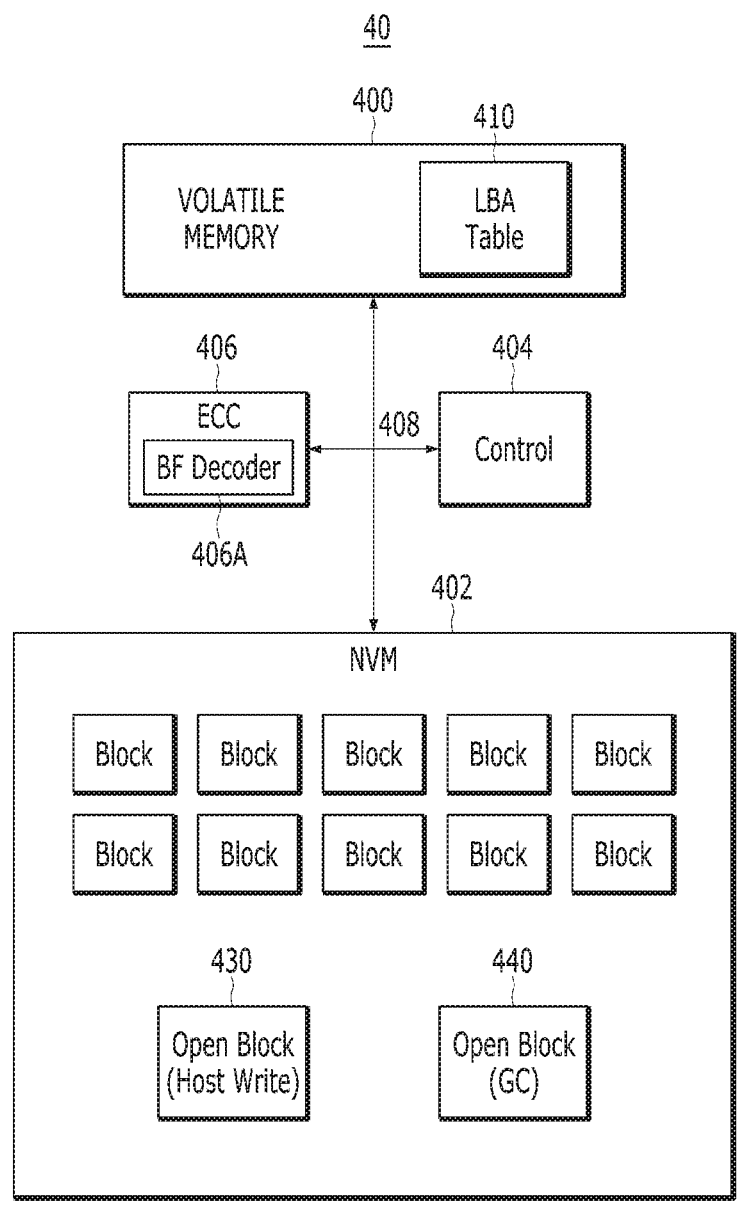
FIG. 4 is a schematic diagram of a memory system in accordance with another embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include a BF decoder 406A, which may correspond to the BF decoder 135 in FIG. 2. The ECC module 406 including its BF decoder 406A may be used to carry out aspects of the present invention. Additional/alternative components that may be utilized with memory systems to effectuate the present invention will be understood by those of skill in the art in light of this disclosure.

As previously noted, embodiments of the present invention provide an inventive checksum-aided error reduction (CA-ER) scheme for bit-flipping (BF) decoding algorithms to improve the performance of BF decoding. The CA-ER scheme is applicable to any type of BF decoding algorithm, including, but not limited to, a weighted BF algorithm, a gradient descent bit BF algorithm, a parallel weighted BF algorithm, as well as variants thereof. That is, the techniques and methods described herein may be integrated into any suitable BF decoding algorithm to improve the decoding performance of LDPC codes.

In describing embodiments of the present invention, the following terms and notation is used. Such terms and notation is adopted for the purpose of describing embodiments of the invention, not limiting it. For the $j^{th}$ variable node in the $i^{th}$ iteration, the flipping threshold, flipping energy and hard decision of a BF decoding algorithm are represented by $T^{(i)}(j)$, $E^{(i)}(j)$ and $y^{(i)}(j)$, respectively. Then, in an embodiment, the flipping rule is: when $T^{(i)}(j) < E^{(i)}(j)$, the $j^{th}$ bit of a hard decision is flipped in the $i^{th}$ iteration, i.e., $y^{(i)}(j) = y^{(i-1)}(j) \oplus 1$; otherwise, $y^{(i)}(j) = y^{(i-1)}(j)$. Here '$\oplus$' represents a binary exclusive-or (XOR) operation. Then, the current checksum value, that is, the checksum value after processing the $j^{th}$ variable node at the $i^{th}$ iteration, represented by $CS^{(i)}(j)$, may be updated by using the new hard decision result for the $i^{th}$ variable node. The checksum value represents the number of unsatisfied check nodes (parities). A $(j-1)^{th}$ variable node may be a previously processed variable node, e.g., the variable node processed immediately before the $j^{th}$ variable node or simply a previous variable node.

The new CA-ER scheme operates as follows. After the $j^{th}$ variable node is decoded by the above-identified flipping rule, $CS^{(i)}(j)$ is calculated. If $CS^{(i)}(j) > CS^{(i)}(j-1)$, which means that the current hard-decision of the $j^{th}$ variable node leads to more unsatisfied check nodes and that it might be a bad decision, $y^{(i)}(j)$ is flipped back to $y^{(i-1)}(j)$ and $CS^{(i)}(j)$ $=CS^{(i)})(j-1)$.

The value of $CS^{(i)}(j-1)$ determines whether or not the new CA-ER scheme is used for the $j^{th}$ variable node in the $i^{th}$ iteration. Given a checksum threshold, $T_{CS}$, if $CS^{(i)}(j-1) < T_{CS}$ and $CS^{(i)}(j-1) < CS^{(i)}(j)$ the CA-ER scheme is used for the $j^{th}$ variable node. If $CS^{(i)}j-1) \geq T_{CS}$ or $CS^{(i)}(j-1) \geq CS^{(i)}(j)$, the CA-ER scheme is not used. $T_{CS}$ may be set based on parameters of the system and/or quality-of-service (QoS) requirements. As such, $T_{CS}$, may be predefined.

Figure 5:
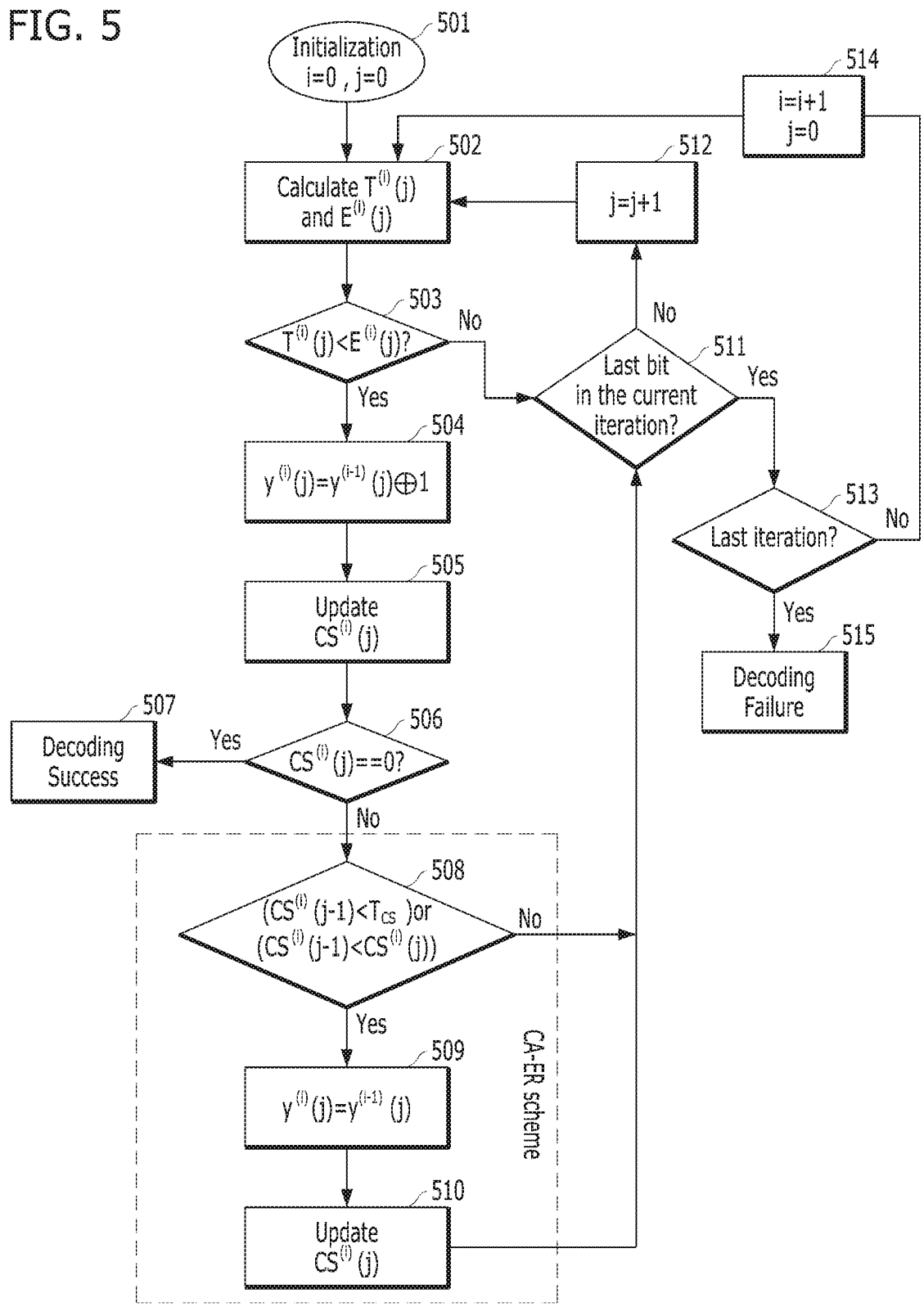
FIG. 5 is a flow chart illustrating decoding using a checksum-aided error reduction (CA-ER) scheme in accordance with an embodiment of the present invention.

Exemplary BF decoding flow with the CA-ER scheme is shown in the flow chart of FIG. 5. BF decoder 135/406A may be used, alone or in combination with one or more other components, to carry out the decoding in accordance with embodiments of the present invention.

Referring to the flow chart 500 of FIG. 5, with secondary reference to other figures, at step 501, the iteration and variable nodes variables i and j respectively are each initialized, e.g., to 0. At step 502, each of the flipping threshold $T^{(i)}(j)$ and the flipping energy $E^{(i)}(j)$ is calculated. Then, it is determined at step 503 whether $T^{(i)}(j) < E^{(i)}(j)$. If yes, the flow moves to step 504, where the $j^{th}$ bit of a hard decision is flipped in the $i^{th}$ iteration, that is, $y^{(i)}(j) = y^{(i-1)}(j) \oplus 1$. At step 505, the checksum value $CS^{(i)})(j)$ is updated.

It is then determined at step 506 whether the updated checksum value is 0. If so, the decoding is deemed a success, as indicated at step 507. If, however, the checksum value is still not 0 after being updated, the checksum value after processing the previous variable node, i.e., $CS^{(i)}(j-1)$, is used to determine whether or not to apply features of a checksum-aided error recovery (CA-ER) scheme according to embodiments of the invention. Specifically, at step 508, it is determined whether $CS^{(i)}(j-1)$ is less than the checksum threshold $T_{CS}$ or $CS^{(i)}(j)$, If so, steps 509 and 510 of the CA-ER scheme are applied. In the illustrated embodiment, the CA-ER scheme includes steps 508, 509 and 510. However, in another embodiment, the CA-ER scheme may include steps 509 and 510, with step 508 being used to determine whether or not to apply steps 509 and 510 of the CA-ER scheme. If $CS^{(i)}(j-1)$ is not less than either the checksum threshold $T_{CS}$ and $CS^{(i)}(j)$, at step 509, $y^{(i)}(j)$ is flipped back to $y^{(i-1)}(j)$, and then at step 510, $CS^{(i)}(j)$ is updated to $CS^{(i)}(j-1)$.

After executing step 510, the flow moves to step 511. The flow also moves to step 511 if the decision at step 508 is "No," and also at step 503, if $T^{(i)}(j) \geq E^{(i)}(j)$.

At step 511, it is determined whether or not the current bit is the last bit in the current iteration. If not, j is incremented at step 512, after which the flow returns to step 502.

On the other hand, if it is determined at step 511 that the current bit is the last bit in the current iteration, it is next determined at step 513, if the current iteration is the last iteration. If not, the flow moves to step 514, where i is incremented while j remains the same. Processing then returns to step 502, beginning another iteration. If the current iteration is the last iteration, as determined at step 513, the decoding is deemed a failure as indicated at step 515.

Figure 6:
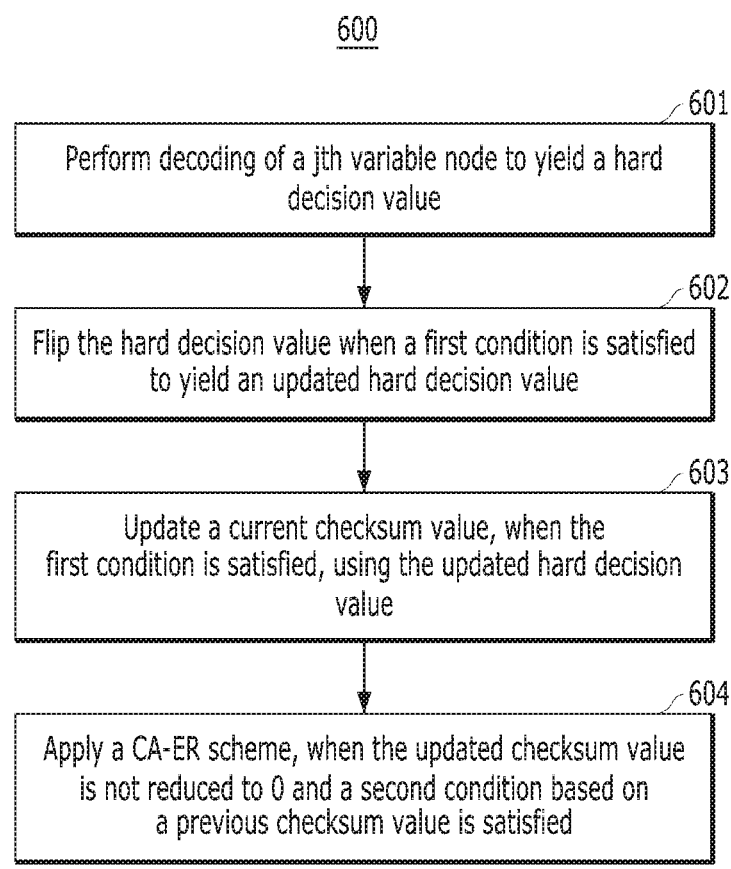
FIG. 6 is a flow chart illustrating steps in processes for bit-flipping (BF) decoding with application of a CA-ER scheme, in accordance with embodiments of the present invention.

FIG. 6 is a flow chart more generally describing steps in processes for decoding LDPC codes in accordance with embodiments of the present invention. The steps shown in flow chart 600 are exemplary. Those skilled in the art will understand that additional and/or alternative steps may be performed, or that the order of steps may be changed, to effectuate aspects of the present invention without departing from the inventive concepts disclosed herein. The steps may be performed by any suitable component or combination of components, including, for example the ECC component 130, 406 (or BF decoder 135, 406A therein). With that in mind, FIG. 6 is described with reference to other figures, particularly FIGS. 2, 4 and 5.

Referring to FIG. 6, an iteration of decoding a codeword among those received is considered. At step 601, decoding of a $j^{th}$ variable node is performed to yield a hard decision value. When a first condition is satisfied, that hard decision value is changed, e.g., flipped, at step 602, to yield an updated hard decision value. The updated hard decision value, when generated, is then used to update a current checksum value, that is, the checksum value after processing the $j^{th}$ variable node at step 603. If the updated checksum value is now zero, or reduced to a set minimum value, the decoding of the present codeword is deemed a success. If not, a second condition is evaluated to determine whether to apply the CA-ER scheme. Thus, at step 604, the CA-ER scheme is applied, when either of the two inequalities or comparisons of the second condition based on a previous checksum value after processing a $(j-1)^{th}$ variable node is satisfied.

The first condition may be that described in connection with step 503 of FIG. 5. The second condition, which includes both comparisons or inequalities, may be that described in connection with step 508 of FIG. 5.

As the foregoing demonstrates, embodiments of the present invention provide improved BF decoding of LDPC codes by employing a CA-ER scheme. The decoding scheme improves performance of memory systems, especially mobile and client SSD applications. Decoding performance is improved while still meeting power consumption requirements.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
    a storage to store codewords of a low-density parity-check (LDPC) code representable by at least variable nodes; and
    a decoder operably coupled to the storage and configured to perform decoding on the codewords;
    wherein, in an i-th iteration of decoding of a codeword among the codewords, the memory controller including the decoder is configured to:
    perform decoding of a j-th variable node to yield a hard decision value,
    change the hard decision value of the j-th variable node when a first condition is satisfied to yield an updated hard decision value,
    update a checksum value of the j-th variable node, when the first condition is satisfied, using the updated hard decision value, and apply a checksum-aided error recovery (CA-ER) scheme for the j-th variable node in the i-th iteration, when the updated checksum value is not reduced to a set minimum and a second condition is satisfied, wherein it is determined that the second condition is satisfied when a checksum value of a (j−1)-th variable node is less than either a checksum threshold or the checksum value of the j-th variable node.

2. The memory controller of claim 1, wherein it is determined that the first condition is satisfied based on a flipping threshold and flipping energy for the j-th variable node.

3. The memory controller of claim 2, wherein it is determined that the first condition is satisfied when the flipping threshold is less than the flipping energy.

4. The memory controller of claim 1, wherein the CA-ER scheme includes replacing the hard decision value for the j-th variable node with a hard decision value for the (j−1)-th variable node.

5. The memory controller of claim 4, wherein the CA-ER scheme further includes updating the checksum value of the j-th variable node using the hard decision value for the (j−1)-th variable node.

6. The memory controller of claim 1, wherein the LDPC code is an irregular LDPC code.

7. A decoder for decoding received codewords of a low-density parity-check (LDPC) code representable by at least variable nodes, the decoder configured to:
perform decoding on the codewords;
wherein, in an i-th iteration of decoding of a codeword among the codewords, the decoder is further configured to:
perform decoding of a j-th variable node to yield a hard decision value,
change the hard decision value of the j-th variable node when a first condition is satisfied to yield an updated hard decision value,
update a checksum value of the j-th variable node, when the first condition is satisfied, using the updated hard decision value, and
apply a checksum-aided error recovery (CA-ER) scheme for the j-th variable node in the i-th iteration, when the updated checksum value is not reduced to a set minimum and a second condition is satisfied,
wherein it is determined that the second condition is satisfied when a checksum value of a (j−1)-th variable node is less than either a checksum threshold or the checksum value of the j-th variable node.

8. The decoder of claim 7, wherein the decoder includes a bit-flipping (BF) decoding module.

9. The decoder of claim 7, wherein the set minimum is zero.

10. A method for decoding received codewords of a low-density parity-check (LDPC) code representable by at least variable nodes, the method comprising:
in an i-th iteration of decoding of a codeword among the codewords
performing decoding of a j-th variable node to yield a hard decision value;
changing the hard decision value of the j-th variable node when a first condition is satisfied to yield an updated hard decision value;
updating a checksum value of the j-th variable node, when the first condition is satisfied, using the updated hard decision value; and
applying a checksum-aided error recovery (CA-ER) scheme for the j-th variable node in the i-th iteration, when the updated checksum value is not reduced to a set minimum and a second condition is satisfied,
wherein it is determined that the second condition is satisfied when a checksum value of a (j−1)-th variable node is less than either a checksum threshold or the checksum value of the j-th variable node.

11. The method of claim 10, wherein it is determined that the first condition is satisfied based on a flipping threshold and flipping energy for the select variable node.

12. The method of claim 11, wherein it is determined that the first condition is satisfied when the flipping threshold is less than the flipping energy.

13. The method of claim 10, wherein the applying of the CA-ER scheme includes replacing the hard decision value for the select j-th variable node with a hard decision value for the (j−1)-th variable node.

14. The method of claim 13, wherein the applying of the CA-ER scheme further includes updating the checksum value of the j-th variable node using the hard decision value for the (j−1)-th variable node.

15. The decoder of claim 7, wherein it is determined that the first condition is satisfied based on a flipping threshold and a flipping energy for the select variable node.

16. The decoder of claim 15, wherein it is determined that the first condition is satisfied when the flipping threshold is less than the flipping energy.

17. The decoder of claim 7, wherein the CA-ER scheme includes replacing the hard decision value for the j-th variable node with a hard decision value for the (j−1)-th variable node.

18. The decoder of claim 17, wherein the CA-ER scheme further includes updating the checksum value of the j-th variable node using the hard decision value for the (j−1)-th variable node.

* * * * *